US011335749B2

(12) United States Patent
Kim et al.

(10) Patent No.: US 11,335,749 B2
(45) Date of Patent: May 17, 2022

(54) ORGANIC LIGHT-EMITTING DISPLAY APPARATUS

(71) Applicant: SAMSUNG DISPLAY CO., LTD., Yongin-si (KR)

(72) Inventors: Kihoon Kim, Yongin-si (KR); Deukjong Kim, Yongin-si (KR); Keunsoo Lee, Yongin-si (KR); Donghyun Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 230 days.

(21) Appl. No.: 15/431,082

(22) Filed: Feb. 13, 2017

(65) Prior Publication Data

US 2017/0287996 A1    Oct. 5, 2017

(30) Foreign Application Priority Data

Apr. 4, 2016 (KR) .......................... 10-2016-0041253

(51) Int. Cl.
*H01L 27/32* (2006.01)
(52) U.S. Cl.
CPC ...... *H01L 27/3258* (2013.01); *H01L 27/3248* (2013.01); *H01L 27/3262* (2013.01); *H01L 27/3265* (2013.01); *H01L 27/3272* (2013.01); *H01L 27/3276* (2013.01)
(58) Field of Classification Search
CPC . H01L 27/3248; H01L 27/3258; H01L 27/32; H01L 27/3262
See application file for complete search history.

(56) References Cited

U.S. PATENT DOCUMENTS

| 6,995,048 | B2 | 2/2006 | Yoneda et al. |
| 7,508,004 | B2 | 3/2009 | Ishiguro |
| 9,035,330 | B2 | 5/2015 | Kang et al. |
| 9,570,528 | B2 | 2/2017 | You et al. |
| 10,068,989 | B2 | 9/2018 | Jin et al. |
| 2003/0146439 | A1 | 8/2003 | Yamazaki et al. |

(Continued)

FOREIGN PATENT DOCUMENTS

| EP | 1 808 898 A2 | 7/2007 |
| JP | 2005-031651 A | 2/2005 |

(Continued)

OTHER PUBLICATIONS

Extended European Search Report by the EPO dated Sep. 14, 2017 in the examination of the European Application No. 17164379.4.

*Primary Examiner* — Kenneth Parker
*Assistant Examiner* — Long H Le
(74) *Attorney, Agent, or Firm* — Kile Park Reed & Houtteman PLLC

(57) ABSTRACT

An organic light-emitting display apparatus includes a plurality of pixels. At least one of the pixels includes a first conductive layer over a substrate, a first organic insulating layer including a first opening exposing a portion of the first conductive layer, a first inorganic insulating layer over the first organic insulating layer and including a second opening exposing the portion of the first conductive layer exposed through the first opening, and a second conductive layer on the first inorganic insulating layer and contacting the portion of the first conductive layer exposed through the first opening and the second opening.

20 Claims, 14 Drawing Sheets

(56) References Cited

U.S. PATENT DOCUMENTS

| | | | |
|---|---|---|---|
| 2003/0189207 A1 | 10/2003 | Murakami et al. | |
| 2004/0072380 A1 | 4/2004 | Yamazaki et al. | |
| 2007/0052352 A1* | 3/2007 | Im | H01L 27/3246 313/506 |
| 2008/0128686 A1* | 6/2008 | Kwon | H01L 51/5218 257/40 |
| 2009/0057671 A1* | 3/2009 | Ryu | G02F 1/133514 257/59 |
| 2010/0171138 A1* | 7/2010 | Yamazaki | H05B 33/12 257/98 |
| 2011/0133215 A1* | 6/2011 | Kang | H01L 27/3279 257/88 |
| 2013/0069067 A1* | 3/2013 | Youn | H01L 51/5228 257/59 |
| 2013/0153870 A1* | 6/2013 | Seo | H01L 51/5262 257/40 |
| 2014/0035456 A1 | 2/2014 | Isa | |
| 2014/0092354 A1* | 4/2014 | Moriwaki | H01L 27/3258 349/138 |
| 2015/0138463 A1* | 5/2015 | Jinta | H01L 51/5218 349/33 |
| 2015/0349044 A1 | 12/2015 | Iida et al. | |
| 2017/0131585 A1* | 5/2017 | Cho | G02F 1/13338 |

FOREIGN PATENT DOCUMENTS

| | | |
|---|---|---|
| JP | 2008-129157 A | 6/2008 |
| JP | 2013-222178 A | 10/2013 |
| JP | 2013-231977 A | 11/2013 |
| KR | 10-2006-0001377 A | 1/2006 |
| KR | 10-1146991 B1 | 5/2012 |
| TW | 201423976 | 6/2014 |
| TW | 201503329 | 1/2015 |
| WO | WO 02/095834 A1 | 11/2002 |

* cited by examiner

ORGANIC LIGHT-EMITTING DISPLAY APPARATUS

CROSS-REFERENCE TO RELATED APPLICATION

Korean Patent Application No. 10-2016-0041253, filed on Apr. 4, 2016, and entitled, "Organic Light-Emitting Display Apparatus," is incorporated by reference herein in its entirety.

BACKGROUND

1. Field

One or more embodiments relate to an organic light-emitting display apparatus.

2. Description of the Related Art

An organic light-emitting display includes a plurality of pixels. Each pixel has at least one thin-film transistor (TFT) and at least one capacitor connected to a plurality of wires. The TFTs, capacitors, and wires are arranged on a substrate according to minute patterns that tend to be complex. The demand for compact, higher resolution displays is a driving factor for an efficient arrangement of TFTs, capacitors, and wires, as well as a reduction in the complexity of their connection structures and driving techniques.

SUMMARY

In accordance with one or more embodiments, an organic light-emitting display apparatus includes a plurality of pixels, at least one of the pixels including: a first conductive layer over a substrate; a first organic insulating layer including a first opening exposing a portion of the first conductive layer; a first inorganic insulating layer over the first organic insulating layer and including a second opening exposing the portion of the first conductive layer exposed through the first opening; and a second conductive layer on the first inorganic insulating layer and contacting the portion of the first conductive layer exposed through the first opening and the second opening.

The apparatus may include a thin film transistor (TFT) including an active layer and a gate electrode insulated from the active layer, wherein the active layer includes a channel region to connect a source region and a drain region and wherein the first conductive layer is electrically connected to the source region or the drain region. A thickness of the first organic insulating layer may be greater than a thickness of the first inorganic insulating layer.

The apparatus may include a second organic insulating layer over the second conductive layer. The first inorganic insulating layer may include a plurality of additional openings exposing the first organic insulating layer. The first organic insulating layer may directly contact the second organic insulating layer directly through at least one of the additional openings.

The apparatus may include a second inorganic insulating layer between the second conductive layer and the second organic insulating layer. The second inorganic insulating layer may cover edges of the second conductive layer and includes a portion that contacts the first inorganic insulating layer. The second organic insulating layer may include a third opening exposing the second conductive layer.

The apparatus may include a pixel electrode contacting the second conductive layer through the third opening; an intermediate layer over the pixel electrode and including an emission layer; and an opposite electrode over the intermediate layer. The apparatus may include a lower power supply line on a same layer as the first conductive layer, and an upper power supply line on a same layer as the second conductive layer. The lower power supply line and the upper power supply line may be electrically connected to each other through contact holes in the first organic insulating layer and the first inorganic insulating layer. The apparatus may include a storage capacitor including a first plate over the substrate and a second plate facing the first plate, wherein the second plate is on a layer different from the lower power supply line and the upper power supply line and is electrically connected to the lower power supply line and the upper power supply line.

The apparatus may include the first organic insulating layer includes polyimide, and the first inorganic insulating layer includes silicon oxide ($SiO_2$) or silicon nitride ($SiN_x$). The second conductive layer may include a first layer which includes titanium, a second layer which includes aluminum, and a third layer which includes titanium. The apparatus may include a width of the first opening is greater than a width of the second opening, and the first inorganic insulating layer includes a portion that contacts the first conductive layer in the first opening.

In accordance with one or more other embodiments, a pixel includes first and second conductive layers, first and second insulating layers; wherein the first and second insulating layers are between the first and second conductive layers and the second insulating layer is between the first insulating layer and the second conductive layer, and wherein the first insulating layer includes an organic material and the second insulating layer includes an inorganic material, the first conductive layer contacting the second conductive layer through holes in the first and second insulating layers. The hole in the first insulating layer may be aligned with the hole in the second insulating layer. The first and second insulting layers may have different thicknesses. The second insulating layer may be thinner than the first insulating layer. The pixel may include a pixel electrode contacting the second conductive layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
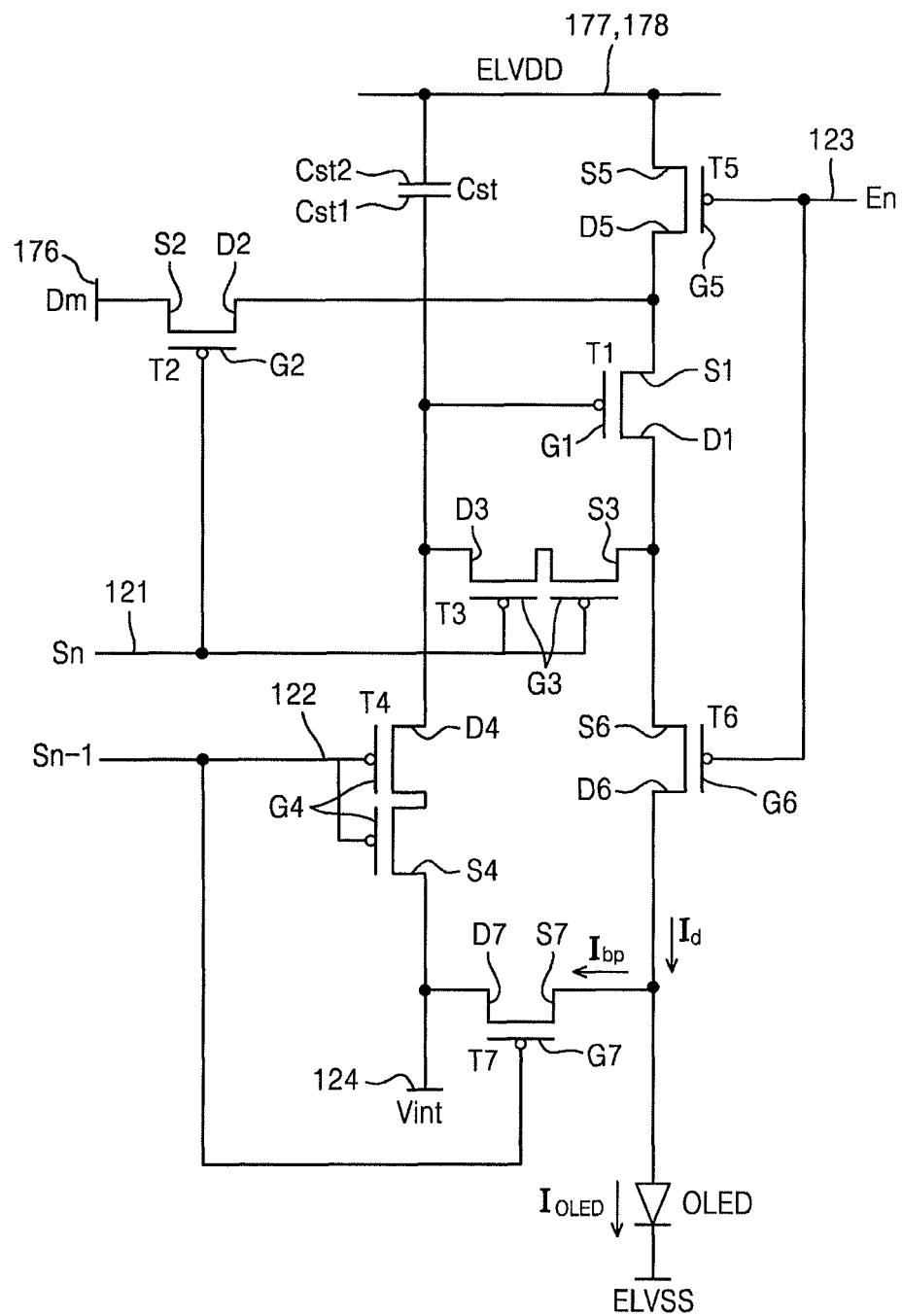
FIG. 1 illustrates an embodiment of a sub-pixel of an organic light-emitting display.

Example embodiments will now be described hereinafter with reference to the accompanying drawings; however, they may be embodied in different forms and should not be construed as limited to the embodiments herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

One or more embodiments described herein correspond to an active matrix (AM)-type organic light-emitting display apparatus with a 7Tr-1Cap sub-pixel structure, i.e., 7 thin-film transistors (TFTs) and 1 capacitor. In another embodiment, the organic light-emitting display apparatus may include different sub-pixel structure, e.g., greater or fewer than 7 TFTs and one or more capacitors. Also, in one or more embodiments, the wiring structure may be different for different embodiments. Also, in one or more embodiments, a sub-pixel may be considered to be a minimum unit emitting light for purposes of displaying an image.

FIG. 1 illustrates an embodiment of a sub-pixel of an organic light-emitting display apparatus. Referring to FIG. 1, the sub-pixel includes a plurality of signal lines, a plurality of TFTs connected to the signal lines, a storage capacitor Cst, and an organic light-emitting device OLED. The signal lines may be shared among multiple sub-pixels.

The TFTs include a driving TFT T1, a switching TFT T2, a compensation TFT T3, a initialization TFT T4, a driving control TFT T5, a emission control TFT T6, and a bypass TFT T7.

The signal lines include a scan line 121 to deliver a scan signal Sn, a previous scan line 122 to deliver a previous scan signal Sn−1 to the initialization TFT T4 and the bypass TFT T7, an emission control line 123 to deliver an emission control signal En to the driving control TFT T5 and the emission control TFT T6, a data line 176 crossing the scan line 121 to deliver a data signal Dm, power supply lines substantially parallel to the data line 176 to deliver a driving voltage ELVDD, and an initialization voltage line 124 to deliver an initialization voltage Vint to initialize the driving TFT T1. The power supply lines may include a lower power supply line 177 and an upper power supply line 178 on different layers and electrically connected to each other.

The driving TFT T1 includes a gate electrode G1 connected to a first storage capacitor plate Cst1 of the storage capacitor Cst, a source electrode S1 connected to the power supply lines 177 and 178 via the driving control TFT T5, and a drain electrode D1 electrically connected to a pixel electrode of the organic light-emitting device OLED via the emission control TFT T6. The driving TFT T1 receives the data signal Dm according to a switching operation by the switching TFT T2 and supplies emission current $I_{OLED}$ to the organic light-emitting device OLED.

The switching TFT T2 includes a gate electrode G2 connected to the scan line 121, a source electrode S2 connected to the data line 176, a drain electrode D2 connected to the source electrode S1 of the driving TFT T1 and to the power supply lines 177 and 178 via the driving control TFT T5. The switching TFT T2 is turned on according to the scan signal Sn received via the scan line 121 and performs a switching operation to deliver the data signal Dm from the data line 176 to the source electrode S1 of the driving TFT T1.

The compensation TFT T3 includes a gate electrode G3 connected to the scan line 121, a source electrode S3 connected to the drain electrode D1 of the driving TFT T1 and to a pixel electrode 191 (refer, e.g., to FIG. 8) of the organic light-emitting device OLED via the emission control TFT T6, and a drain electrode D3 connected to the first storage capacitor plate Cst1 of the storage capacitor Cst, a drain electrode D4 of the initialization TFT T4, and the gate electrode G1 of the driving TFT T1. The compensation TFT T3 is turned on according to the scan signal Sn from the scan line 121 to electrically connect the gate electrode G1 and drain electrode D1 of the driving TFT T1, thereby placing the driving TFT T1 in a diode-connected state.

The initialization TFT T4 includes a gate electrode G4 connected to the previous scan line 122, a source electrode S4 connected to a drain electrode D7 of the bypass TFT T7 and the initialization voltage line 124, and a drain electrode D4 connected to the first storage capacitor plate Cst1 of the storage capacitor Cst, the drain electrode D3 of the compensation TFT T3, and the gate electrode G1 of the driving TFT T1. The initialization TFT T4 is turned on according to the previous scan signal Sn−1 from the previous scan line 122 to deliver the initialization voltage Vint to the gate electrode G1 of the driving TFT T1, for purposes of initializing a voltage of the gate electrode G1 of the driving TFT T1.

The driving control TFT T5 includes a gate electrode G5 connected to the emission control line 123, a source electrode S5 connected to the power supply lines 177 and 178, and a drain electrode D5 connected to the source electrode S1 of the driving TFT T1 and the drain electrode D2 of the switching TFT T2.

The emission control TFT T6 includes a gate electrode G6 connected to the emission control line 123, a source electrode S6 connected to the drain electrode D1 of the driving TFT T1 and the source electrode S3 of the compensation TFT T3, and a drain electrode D6 electrically connected to a source electrode S7 of the bypass TFT T7 and the pixel electrode 191 (refer, e.g., to FIG. 8) of the organic light-emitting device OLED. The driving control TFT T5 and emission control TFT T6 are simultaneously turned on according to the emission control signal En from the emission control line 123 to allow the emission current $I_{OLED}$ to flow to the organic light-emitting device OLED, based on a connection of the driving voltage ELVDD to organic light-emitting device OLED.

The bypass TFT T7 includes a gate electrode G7 connected to the previous scan line 122, a source electrode S7 connected to the drain electrode D6 of the emission control TFT T6 and the pixel electrode 191 (refer, e.g., to FIG. 8) of the organic light-emitting device OLED, and a drain electrode D7 connected to the initialization voltage line 124. The bypass TFT T7 delivers the previous scan signal Sn−1 from the previous scan line 122 to the gate electrode G7. The previous scan signal Sn−1 indicates a voltage having a predetermined level for turning off the bypass TFT T7. When the bypass TFT T7 is turned off, a portion of driving current $I_d$ flows as bypass current $I_{bp}$ via the bypass TFT T7.

When the sub-pixel is to operate based on a black image grayscale value, a black image grayscale value will not be displayed by the sub-pixel if a minimum amount of current flows as driving current from of the driving TFT T1 into the organic light-emitting device OLED. The minimum current of the driving TFT T1 may correspond, for example, to current that flows when a gate-source voltage $V_{GS}$ of the driving TFT T1 is less than a threshold voltage $V_{th}$, such that the driving TFT T1 is turned off.

In order to prevent emission of light from the organic light-emitting device OLED when a minimum current flows as driving current, the bypass TFT T7 may direct the portion of the driving current $I_d$, which flows out of the driving TFT T1 as the bypass current $I_{bp}$, to a current path away from the organic light-emitting device OLED. For example, current less than a minimum driving current (e.g., current equal to or less than 10 pA) that flows when the driving TFT T1 is turned off may be delivered to the organic light-emitting device OLED. As a result, an improvement is the display of black image data may be realized.

When a minimum driving current flows at a time when the sub-pixel is intended to display a black image value, emission or non-emission or a level of emission of light from the organic light-emitting device OLED may be significantly affected. This is because the bypass current $I_{bp}$ diverges from the minimum driving current. However, when a large driving current flows when the sub-pixel is to display an different from a black image or even a white image, the level of emission of the organic light-emitting device OLED is hardly affected by the bypass current $I_{bp}$. Therefore, the emission current $I_{OLED}$ of the organic light-emitting device OLED, which is decreased by the bypass current $I_{bp}$ that diverges from the driving current $I_d$ via the bypass TFT T7 when the driving current corresponds to a black image value, may have a level for clearly expressing a black image. By realizing a clear black resolution image using the bypass TFT T7, a contrast ratio may therefore be improved.

The initialization TFT T4 and the bypass TFT T7 in FIG. 1 are connected to the previous scan line 122. In another embodiment, the initialization TFT T4 may be connected to previous scan line 122 and driven according to the previous scan signal Sn−1 and the bypass TFT T7 may be connected to a separate wire and driven according to a signal delivered via the wire.

The storage capacitor Cst includes a second storage capacitor plate Cst2 connected to the power supply lines 177 and 178 and an opposite electrode 193 (refer, e.g., to FIG. 8) of the organic light-emitting device OLED is connected to a common electrode ELVSS. Accordingly, the organic light-emitting device OLED of the sub-pixel may emit light based on emission current $I_{OLED}$ from the driving TFT T1 to emit light of an image.

Each of the compensation TFT T3 and the initialization TFT T4 in FIG. 1 has a dual-gate electrode structure. In another embodiment, one or both of the compensation TFT T3 and initialization TFT T4 may have a one-gate electrode structure. In one embodiment, at least one of the TFTs T1, T2, T5, T6, and T7 other than the compensation TFT T3 and the initialization TFT T4 may have a two-gate electrode structure.

In operation, during an initialization period, the previous scan signal Sn−1 having a low level is supplied via the previous scan line 122. Then, the initialization TFT T4 is turned on based on a low level of the previous scan signal Sn−1 and the initialization voltage Vint from the initialization voltage line 124 is delivered to the gate electrode G1 of the driving TFT T1 via the initialization TFT T4. Thus, the driving TFT T1 is initialized due to the initialization voltage Vint.

During a data programming period, a scan signal Sn having a low level is supplied via the scan line 121. Then, the switching TFT T2 and the compensation TFT T3 are turned on based on a low level of the scan signal Sn. Accordingly, the driving TFT T1 is placed in a diode-connected state by the turned on compensation TFT T3 and is biased in a forward direction.

Then, a compensation voltage Dm+Vth (e.g., Vth is a negative value), obtained by subtracting a threshold voltage Vth of the driving TFT T1 from the data signal Dm supplied via the data line 176, is applied to the gate electrode G1 of the driving TFT T1. Then, the driving voltage ELVDD and the compensation voltage Dm+Vth are applied to both terminals of the storage capacitor Cst, so that charges corresponding to a voltage difference between the respective terminals are stored in the storage capacitor Cst.

During an emission period, an emission control signal En from the emission control line 123 is changed from a high level to a low level. Then, during the emission period, the driving control TFT T5 and the emission control TFT T6 are turned on based on the low level of the emission control signal En.

Then, the driving current $I_d$ is generated based on a difference between a voltage of the gate electrode G1 of the driving TFT T1 and the driving voltage ELVDD. The emission current $I_d$, corresponding to a difference between the driving current $I_d$ and the bypass current $I_{bp}$, is supplied to the organic light-emitting device OLED via the emission control TFT T6.

During the emission period, a gate-source voltage $V_{GS}$ of the driving TFT T1 is maintained at '(Dm+Vth)−ELVDD' due to the storage capacitor Cst, based on the current-voltage relation of the driving TFT T1. The emission current $I_{OLED}$ is proportional to '$(Dm-ELVDD)^2$', e.g., the square of a value obtained by subtracting the threshold voltage Vth from the gate-source voltage $V_{GS}$. Thus, the emission current $I_{OLED}$ is determined regardless of the threshold voltage Vth of the driving TFT T1.

The TFTs T1, T2, T3, T4, T5, T6, and T7 may be p-channel field-effect transistors. In another embodiment, at least some of the TFTs T1, T2, T3, T4, T5, T6, and T7 may be n-channel field-effect transistors.

Figure 2:
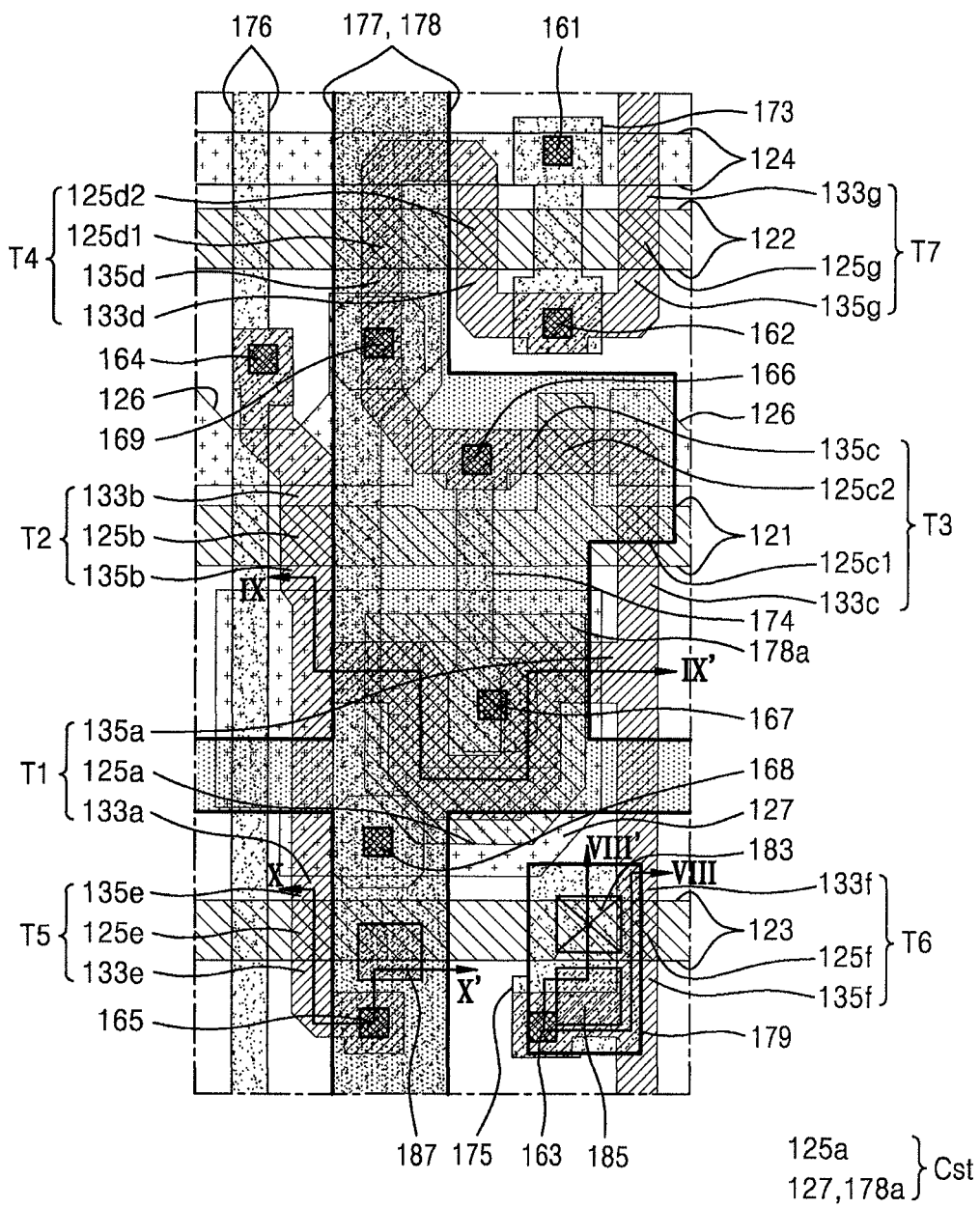
FIG. 2 illustrates a layout embodiment of the TFTs and capacitor of the sub-pixel.

FIG. 2 illustrates a layout embodiment of the sub-pixel in FIG. 1, indicating locations of its TFTs and capacitor. FIGS. 3 to 7 are plan views illustrating various layers of the layout embodiment of the sub-pixel. In particular, FIGS. 3 to 7 illustrates embodiments of wires of a same layer or arrangement of a semiconductor layer.

An insulating layer or the like may be between the layer structures in FIGS. 3 through 7. For example, a first insulating layer 141 may be between a layer of FIG. 3 and a layer of FIG. 4, a second insulating layer 142 may be between the layer of FIG. 4 and a layer of FIG. 5, an interlayer insulating layer 160 may be between the layer of FIG. 5 and a layer of FIG. 6, and a first organic insulating layer 171 and a first inorganic insulating layer 172 on the first organic insulating layer 171 may be between the layer of FIG. 6 and a layer of FIG. 7. An example is illustrated in FIG. 8. The insulating layers may include contact holes to electrically connect various features of the layer structures in FIGS. 3 through 7 in a vertical direction.

Referring to FIGS. 2-7, the sub-pixel includes the scan line 121, the previous scan line 122, the emission control line 123, and the initialization voltage line 124 arranged along a row direction to respectively apply the scan signal Sn, the previous scan signal Sn−1, the emission control signal En, and the initialization voltage Vint to the sub-pixel. The sub-pixel may include the data line 176 and the power supply lines 177 and 178, that cross the scan line 121, the previous scan line 122, the emission control line 123, and the initialization voltage line 124, to respectively apply the data signal Dm and the driving voltage ELVDD to the sub-pixel. The sub-pixel may include the driving TFT T1, the switching TFT T2, the compensation TFT T3, the initialization TFT T4, the driving control TFT T5, the emission control TFT T6, the bypass TFT T7, the storage capacitor Cst, and an organic light-emitting device OLED (refer, e.g., to FIG. 8).

Figure 3:
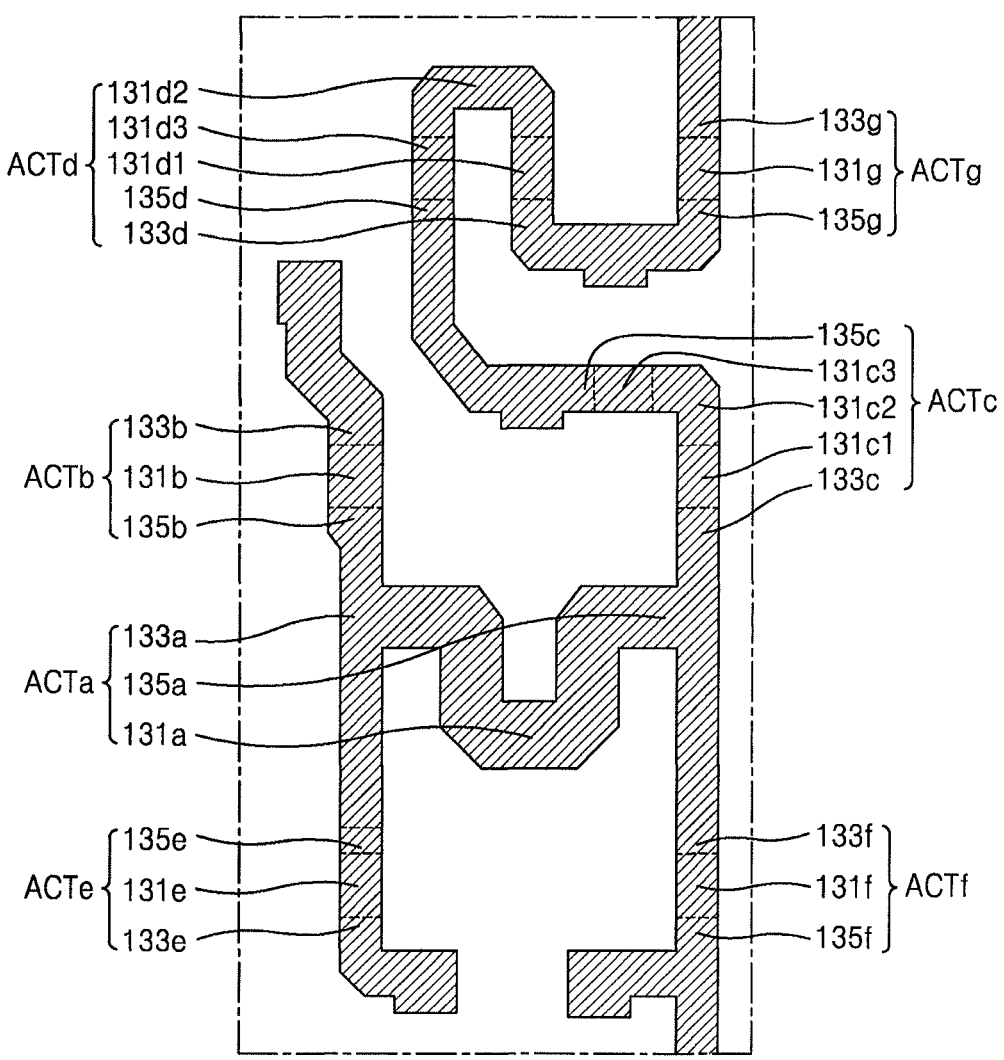
FIGS. 3 to 7 illustrate various layers of the layout embodiment in FIG. 2.

The driving TFT T1, the switching TFT T2, the compensation TFT T3, the initialization TFT T4, the driving control TFT T5, the emission control TFT T6, and the bypass TFT T7 may be formed along an active layer as in FIG. 3. The active layer may have a curved or bent shape and may include a driving active layer ACTa corresponding to the driving TFT T1, a switching active layer ACTb corresponding to the switching TFT T2, a compensation active layer ACTc corresponding to the compensation TFT T3, an initialization active layer ACTd corresponding to the initialization TFT T4, an operation control active layer ACTe corresponding to the driving control TFT T5, an emission control active layer ACTf corresponding to the emission control TFT T6, and a bypass active layer ACTg corresponding to the bypass TFT T7.

The active layer may include, for example, polysilicon and, for example, may include a channel region, a source region, and a drain region. The channel region may not be doped with impurities and thus has semiconductor characteristics. The source and drain regions are on respective sides of the channel region and are doped with impurities and thus have conductivity. The impurity may vary depending on whether the TFT is an N-type or P-type transistor.

The doped source region or the doped drain region may be interpreted as a source electrode or drain electrode of a TFT. For example, a driving source electrode may correspond to a driving source region 133a doped with impurities in a periphery of a driving channel region 131a of the driving active layer ACTa. A driving drain electrode may correspond to a driving drain region 135a doped with impurities in a periphery of the driving channel region 131a. In addition, portions of the active layer between the TFTs may be interpreted as wires doped with impurities and which therefore serve to electrically connect the TFTs.

The storage capacitor Cst may include a first storage capacitor plate 125a and a second storage capacitor plate 127, with a second insulating layer 142 therebetween. The first storage capacitor plate 125a may also function as a driving gate electrode 125a, e.g., the driving gate electrode 125a and the first storage capacitor plate 125a may be integrally formed to have a single-body or unitary construction.

Figure 4:
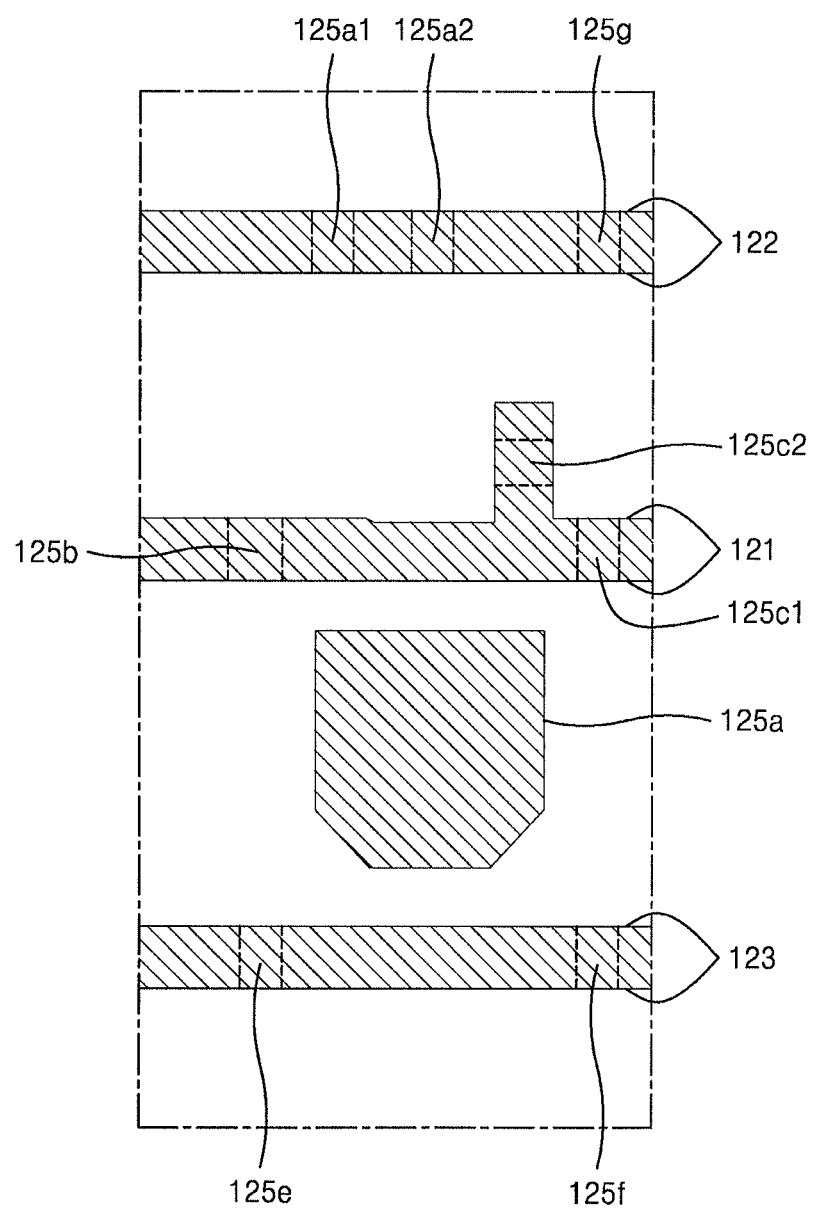

Referring to FIG. 4, the first storage capacitor plate 125a may have an island form spaced apart from an adjacent sub-pixel. The first storage capacitor plate 125a may include the same material layer as the scan line 121, the previous scan line 122, and the emission control line 123.

Figure 5:
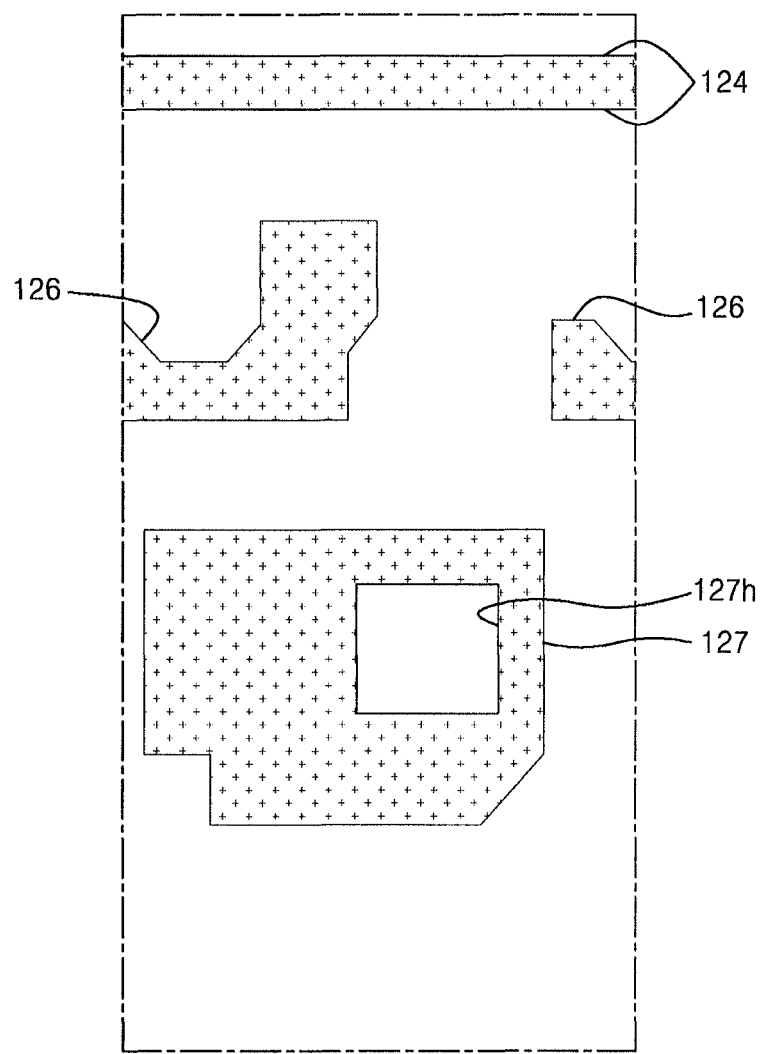

A switching gate electrode 125b and compensation gate electrodes 125c1 and 125c2 may be portions of the scan line 121 or protrusions from the scan line 121 that cross the active layer and initialization gate electrodes 125d1 and 125d2. A bypass gate electrode 125g may be portions of the previous scan line 122 or protrusions from the scan line 121 that cross the active layer. An operation control gate electrode 125e and an emission control gate electrode 125f may be portions of the emission control line 123 or protrusions from the scan line 121 that cross the active layer The second storage capacitor plate 127 may extend over adjacent sub-pixels. Referring to FIG. 5, the second storage capacitor plate 127 may include the same material layer as the initialization voltage line 124 and/or a shield layer 126. A storage opening 127h may be formed in the second storage capacitor plate 127. As a result, the first storage capacitor plate 125a and a drain region 135c of the compensation TFT T3 may be electrically connected to each other using a connection member 174 through the storage opening 127h. The second storage capacitor plate 127 may be connected to the power supply line 177 through a contact hole 168 in the interlayer insulating layer 160.

The driving TFT T1 includes the driving active layer ACTa and the driving gate electrode 125a. The driving active layer ACTa includes the driving source region 133a, the driving drain region 135a, and the driving channel region 131a connecting the driving source region 133a and the driving drain region 135a. The driving gate electrode 125a may also function as the first storage capacitor plate 125a. The driving channel region 131a of the driving active layer ACTa may planarly overlap with the gate electrode 125a. The driving source region 133a and the driving drain region 135a extend in both directions with respect to the driving channel region 131a. A driving source region 176a of the driving TFT T1 is connected to a switching drain region 135b and an operation control drain region 135e. The driving source region 133a is connected to a compensation source region 133c and an emission control source region 133f.

The switching TFT T2 includes the switching active layer ACTb and the switching gate electrode 125b. The switching active layer ACTb includes a switching channel region 131b, a switching source region 133b, and a switching drain region 135b. The switching source region 133b may be electrically connected to the data line 176 through a contact hole 164 in the first insulating layer 141, the second insulating layer 142, and the interlayer insulating layer 160. The switching TFT T2 is used as a switching device to select an emission target sub-pixel. The switching gate electrode 125b is connected to the scan line 121, the switching source region 133b is connected to the data line 176, and the switching drain region 135b is connected to the driving TFT T1 and the driving control TFT T5.

The compensation TFT T3 includes the compensation active layer ACTc and compensation gate electrodes 125c1 and 125c2. The compensation active layer ACTc includes compensation channel regions 131c1, 131c2, and 131c3, a compensation source region 133c, and a compensation drain region 135c. The compensation gate electrodes 125c1 and 125c2 are dual-gate electrodes, including the first compensation electrode 125c1 and the second compensation electrode 125c2, and may function to prevent or decrease the occurrence of leakage current.

The compensation drain region 135c of the compensation TFT T3 may be connected to the first storage capacitor plate 125a via the connection member 174. The compensation channel regions 131c1, 131c2, and 131c3 may include a portion 131*c*1 corresponding to the first compensation electrode 125*c*1, a portion 131*c*2 corresponding to the second compensation electrode 125*c*2, and a portion 131*c*2 between the portions 131*c*1 and 131*c*3.

The shield layer 126 may include the same material layer as the initialization voltage line 124 and the second storage capacitor plate 127, and may be disposed on the portion 131*c*2 and connected to the power supply line 177 through a contact hole 129 in the interlayer insulating layer 160. The portion 131*c*2 between the two portions 131*c*1, 131*c*3 may be doped with impurity to have conductivity. Thus, if the shield layer 126 is not arranged, the data line 176 adjacent to the portion 131*c*2 may form a parasitic capacitor. Since the data line 176 applies data signals to the sub-pixel with different strengths according to the resolution to be realized, the amount of capacitance of the parasitic capacitor may change accordingly. Since the compensation TFT T3 is electrically connected to the driving TFT T1, when the amount of capacitance of the parasitic capacitor in the compensation TFT T3 changes, the driving current $I_d$ and the emission current $I_{OLED}$ change to thereby change the resolution of light emitted from the sub-pixel.

However, if the shield layer 126 is connected to the power supply line 177 and applied with a constant voltage and is arranged on the portion 131*c*2 between the portions 131*c*1 and 131*c*3, the portion 131*c*2 and the shield layer 126 may form a parasitic capacitor having a substantially constant amount of capacitance. The parasitic capacitor may have an amount of capacitance significantly greater than the capacitance of a parasitic capacitor formed by the portion 131*c*2 and the data line 176. The amount of change of the capacitance of the parasitic capacitor, due to a change in a data signal applied to the data line 176, may be very small compared to the amount of capacitance of the parasitic capacitor formed by the portion 131*c*2 and the shield layer 126 and thus may be considered negligible. Therefore, it is possible to prevent a change of resolution of light emitted from the sub-pixel caused by the amount of change of the capacitance of the parasitic capacitor.

Figure 6:
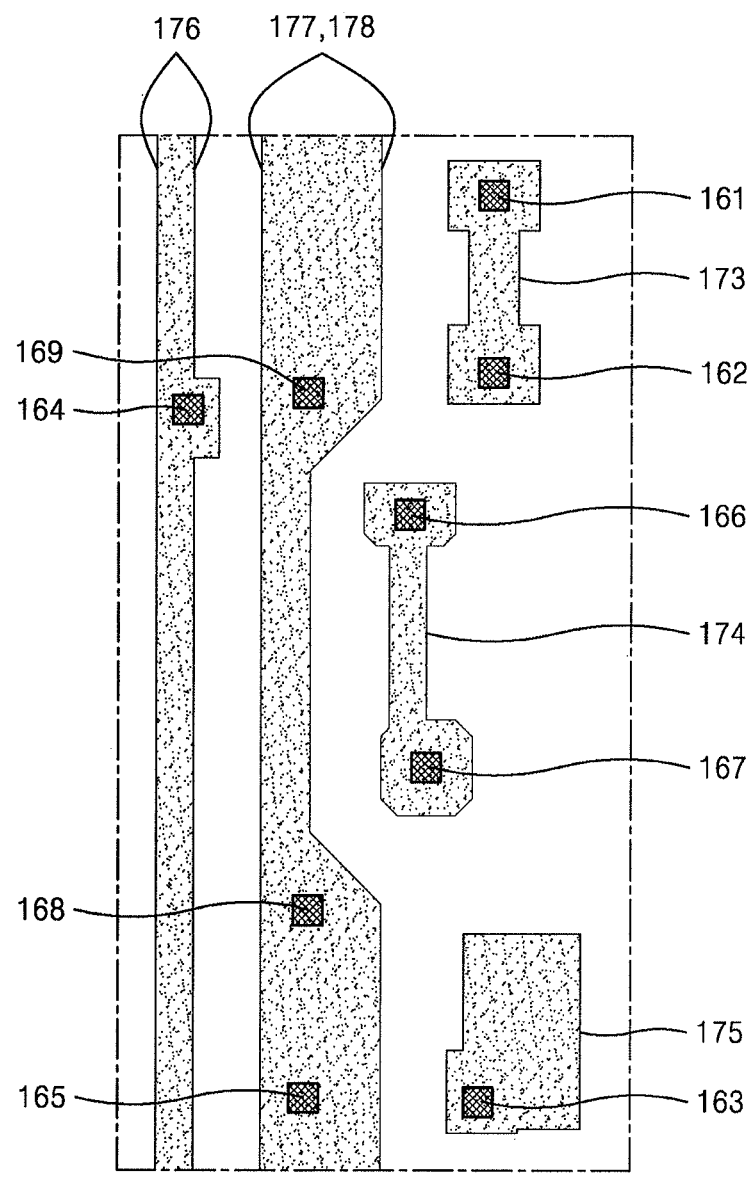

The connection member 174 may include the same material layer as the data line 176 and the lower power supply line 177, as illustrated in FIG. 6. A first end of the connection member 174 is connected to the compensation drain region 135*c* and an initialization drain region 135*d* through a contact hole 166 in the first insulating layer 141, the second insulating layer 142, and the interlayer insulating layer 160. A second end of the connection member 174 may be connected to the first storage capacitor plate 125*a* through a contact hole 167 in the second insulating layer 142 and the interlayer insulating layer 160. The second end of the connection member 174 is connected to the first storage capacitor plate 125*a* through the storage opening 127*h* in the second storage capacitor plate 127. The initialization TFT T4 includes the initialization active layer ACTd and the initialization gate electrodes 125*d*1 and 125*d*2. The initialization active layer ACTd includes initialization channel regions 131*d*1, 131*d*2, and 131*d*3, an initialization source region 133*d*, and an initialization drain region 135*d*.

The initialization gate electrodes 125*d*1 and 125*d*2 have dual-gate electrode structures including the first initialization gate electrode 125*d*1 and the second initialization gate electrode 125*d*2 and may function to prevent or decrease an occurrence of leakage current. The initialization channel regions 131*d*1, 131*d*2, and 131*d*3 includes the region 131*d*1 corresponding to the first initialization gate electrode 125*d*1, the region 131*d*2 corresponding to the second initialization gate electrode 125*d*2, and the region 131*d*3 therebetween.

The initialization source region 133*d* is connected to the initialization voltage line 124 via an initialization connection line 173. A first end of the initialization connection line 173 may be connected to the initialization voltage line 124 through a contact hole 161 in the second insulating layer 142 and the interlayer insulating layer 160. A second end of the initialization connection line 173 may be connected to the initialization source region 133*d* through a contact hole 162 in the first insulating layer 141, the second insulating layer 142, and the interlayer insulating layer 160.

The driving control TFT T5 includes the operation control active layer ACTe and the operation control gate electrode 125*e*. The operation control active layer ACTe includes an operation control channel region 131*e*, an operation control source region 133*e*, and the operation control drain region 135*e*. The operation control source region 133*e* may be electrically connected to the lower power supply line 177 through a contact hole 165 in the first insulating layer 141, the second insulating layer 142, and the interlayer insulating layer 160.

The emission control TFT T6 includes the emission control active layer ACTf and the emission control gate electrode 125*f*, and the emission control active layer ACTf includes an emission control channel region 131*f*, the emission control source region 133*f*, and an emission control drain region 135*f*. A first conductive layer 175 may be above the emission control TFT T6 and may be connected to the emission control drain region 135*f* of the emission control active layer ACTf through a contact hole 163 in the first insulating layer 141, the second insulating layer 142, and the interlayer insulating layer 160.

As illustrated in FIG. 6, the first conductive layer 175 may include the same material layer as the data line 176 and the lower power supply line 177. The first conductive layer 175 is electrically connected to a second conductive layer 179. Thus, the first conductive layer 175 is electrically connected to the pixel electrode 191 (refer, e.g., to FIG. 8) of the organic light-emitting device OLED.

The bypass TFT T7 includes the bypass active layer ACTg and the bypass gate electrode 125*g*. The bypass active layer ACTg includes a bypass source region 133*g*, a bypass drain region 135*g*, and a bypass channel region 131*g*. The bypass drain region 135*g* is connected to the initialization source region 133*d* of the initialization TFT T4 and thus is connected to the initialization voltage line 124 via the initialization connection line 173. The bypass source region 133*g* is electrically connected to the pixel electrode 191 (refer, e.g., to FIG. 8) of the organic light-emitting device OLED.

The second conductive layer 179 may be over the first conductive layer 175 and may be electrically connected to the first conductive layer 175 through a contact hole 183 in the first organic insulating layer 171 and the first inorganic insulating layer 172. The pixel electrode 191 of the organic light-emitting device OLED may be over the second conductive layer 179 and may be connected to the second conductive layer 179 through a contact hole 185 in a second organic insulating layer 181 between the second conductive layer 179 and the pixel electrode 191. For example, the first conductive layer 175 and the second conductive layer 179 may be intermediate connection layers to connect the emission control drain region 135*f* of the emission control active layer ACTf with the pixel electrode 191. These features may correspond, for example, to FIG. 8.

Figure 7:
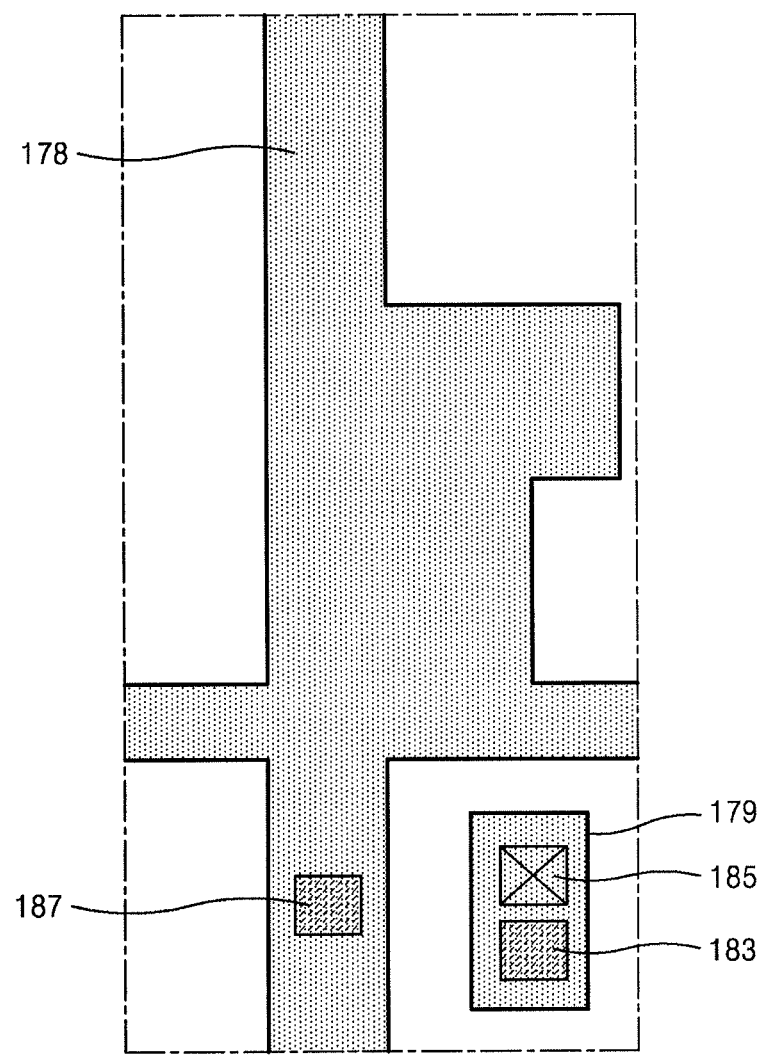
Figure 8:
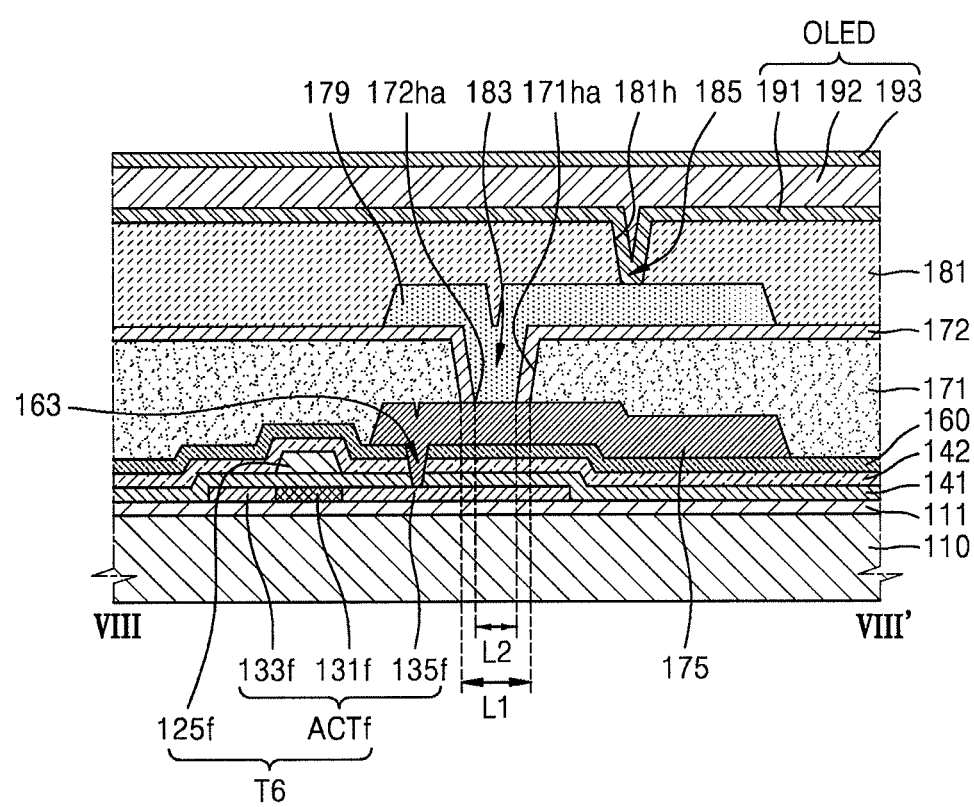
FIG. 8 illustrates an embodiment of the sub-pixel taken along section line VIII-VIII' in FIG. 2.

Referring to FIG. 7, the second conductive layer 179 may include the same material layer as the upper power supply line 178. The upper power supply line 178 may be connected to the lower power supply line 177 through a contact hole 187 in the second organic insulating layer 181. The power supply lines 177 and 178 are the lower power supply line 177 and the upper power supply line 178 that are electrically connected to each other. Due to such configuration, the area of the power supply lines 177 and 178 in the sub-pixel may be reduced or minimized, to thereby reduce a resistance of the power supply lines 177 and 178. By reducing the voltage drop of the power supply lines 177 and 178, image quality may be enhanced.

Figure 9:
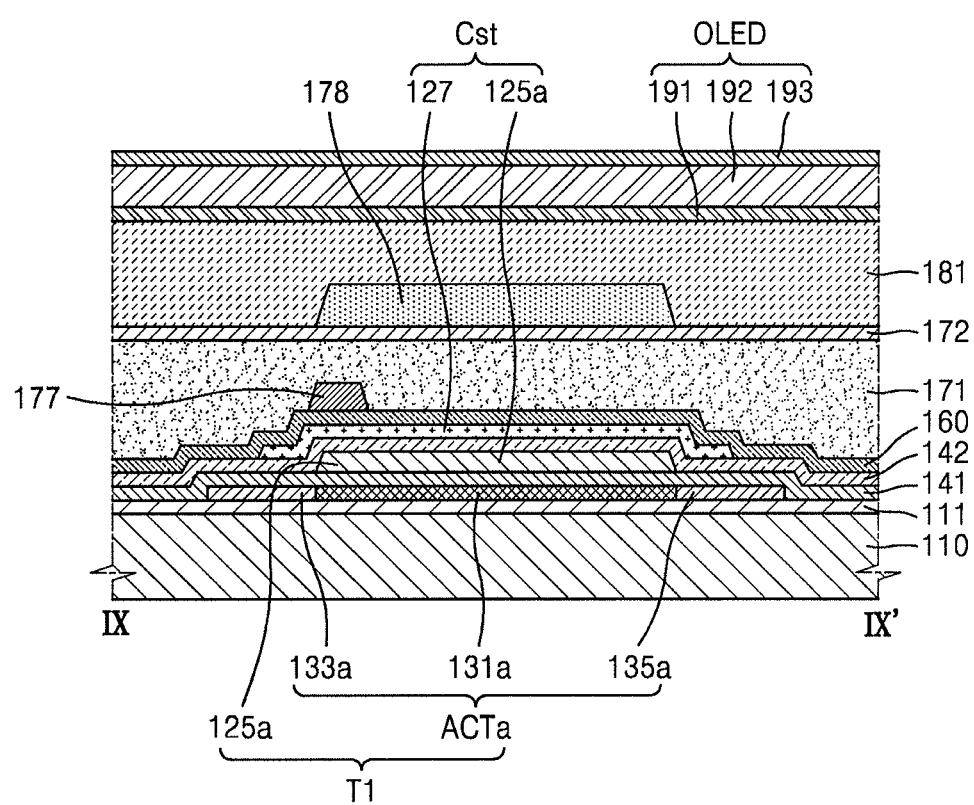
FIG. 9 illustrates an embodiment of the sub-pixel taken along section line IX-IX' in FIG. 2.
Figure 10:
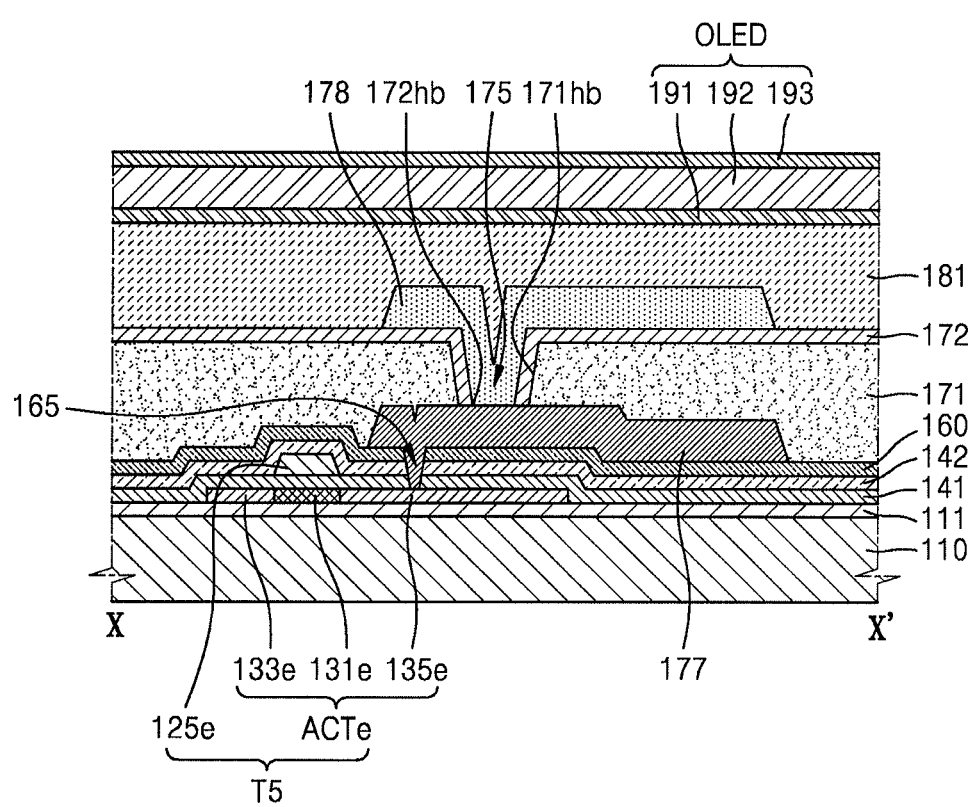
FIG. 10 illustrates an embodiment of the sub-pixel taken along section line X-X' in FIG. 2.

FIG. 8 is a cross-sectional view of the sub-pixel taken along line VIII-VIII' in FIG. 2. FIG. 9 is a cross-sectional view of the sub-pixel taken along line IX-IX' in FIG. 2. FIG. 10 is a cross-sectional view of the sub-pixel taken along a line X-X' in FIG. 2.

Referring to FIGS. 8 to 10, the organic light-emitting display apparatus includes a plurality of pixels, at least some of which include the first conductive layer 175 over the substrate 110, the first organic insulating layer 171 including a first opening 171ha exposing a portion of the first conductive layer 175, the first inorganic insulating layer 172 over the first organic insulating layer 171 and including a second opening 172ha exposing the portion of the first conductive layer 175 which is exposed through the first opening 171ha, and the second conductive layer 179 on the first inorganic insulating layer 172. The second conductive layer 179 contacting the portion of the first conductive layer 175 exposed through the first opening 171ha and the second opening 172ha.

The substrate 110 may include at least one of various materials such as a glass material, a metal material, a plastic material, or the like. According to the present embodiment, the substrate 110 may be a flexible substrate including, for example, a polymer resin such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The substrate 110 may include a display area for displaying an image and a non-display area in a periphery of the display area. Pixels (or subpixels) are arranged in the display area. FIG. 2 illustrates one pixel (or sub-pixel) in the display area of the substrate 110. The TFTs T1, T2, T3, T4, T5, T6, and T7 (refer, e.g., to FIG. 2) and the organic light-emitting device OLED connected to at least one of the TFTs T1, T2, T3, T4, T5, T6, or T7 are over the substrate 110. A cross-sectional structure of the pixel in FIG. 2 will now be described.

Referring to FIGS. 8 to 10, the driving TFT T1, the driving control TFT T5, and the emission control TFT T6 are over the substrate 110. The driving TFT T1 may include the driving active layer ACTa and the driving gate electrode 125a. The driving control TFT T5 may include the operation control active layer ACTe and the operation control gate electrode 125e. The emission control TFT T6 may include the emission control active layer ACTf and the emission control gate electrode 125f. The respective active layers ACTa, ACTe, and ACTf may include amorphous silicon, polycrystalline silicon, or an organic semiconductor material and may include the respective source regions 133a, 133e, and 133f, the respective drain regions 135a, 135e, and 135f, and the respective channel regions 131a, 131e, and 131f to connect the source and drain regions.

The respective gate electrodes 125a, 125e, and 125f are over the respective active layers ACTa, ACTe, and ACTf. Based on a signal applied to the respective gate electrodes 125a, 125e, and 125f, the respective source regions 133a, 133e, and 133f are electrically connected with the respective drain regions 135a, 135e, and 135f.

Each of the gate electrodes 125a, 125e, and 125f may have a single layer or multistack layer structure including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu), for example, taking into consideration adhesion of an adjacent layer, planarization of a surface of a stack-target layer, formability, or the like.

In order to insulate the respective active layers ACTa, ACTe, and ACTf from the respective gate electrodes 125a, 125e, and 125f, the first insulating layer 141 includes an inorganic material (e.g., silicon oxide, silicon nitride, and/or silicon oxynitride) between the active layers ACTa, ACTe, and ACTf and the gate electrodes 125a, 125e, and 125f. In addition, the second insulating layer 142 includes an inorganic material (e.g., silicon oxide, silicon nitride, and/or silicon oxynitride) over the gate electrodes 125a, 125e, and 125f. The interlayer insulating layer 160 may be over the second insulating layer 142. The interlayer insulating layer 160 may include an inorganic material, e.g., silicon oxide, silicon nitride, and/or silicon oxynitride.

A buffer layer 111 includes an inorganic material (e.g., silicon oxide, silicon nitride, and/or silicon oxynitride) between the substrate 110 and the TFTs T1, T5, and T6. The buffer layer 111 may improve planarization of a surface of the substrate 110 or may prevent, minimize, or reduce the penetration of impurities from the substrate 110 into the active layers ACTa, ACTe, and ACTf.

Referring to FIG. 9, the second storage capacitor plate 127 faces the driving gate electrode 125a and may be between the second insulating layer 142 and the interlayer insulating layer 160. The second storage capacitor plate 127 and the driving gate electrode 125a may correspond to the storage capacitor Cst. For example, the driving gate electrode 125a may serve not only as the driving gate electrode 125a of the driving TFT T1 but also the first storage capacitor plate 125a of the storage capacitor Cst.

The first conductive layer 175 and the lower power supply line 177 may be over the interlayer insulating layer 160, and may have a single-layer structure or a multistack layer structure including, for example, at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu), in consideration of conductivity or the like.

For example, each of the first conductive layer 175 and the lower power supply line 177 may have a stack structure of titanium (Ti)/aluminum (Al)/titanium (Ti). The first conductive layer 175 may be electrically connected to the emission control drain region 135f of the emission control active layer ACTf through the contact hole 163 in the first insulating layer 141, the second insulating layer 142, and the interlayer insulating layer 160, and is adjacent to the emission control TFT T6. The lower power supply line 177 may be electrically connected to the operation control source region 133e of the operation control active layer ACTe through the contact hole 165 in the first insulating layer 141, the second insulating layer 142, and the interlayer insulating layer 160 and is adjacent to the driving control TFT T5. The first organic insulating layer 171 may be over the interlayer insulating layer 160 to cover the first conductive layer 175 and the lower power supply line 177. The first inorganic insulating layer 172 may be over the first organic insulating layer 171.

The first organic insulating layer 171 may include an organic material, e.g., acryl, benzocyclobutene (BCB), polyimide, hexamethyldisiloxane (HMDSO). The first inorganic insulating layer 172 may include an inorganic material, e.g., silicon oxide, silicon nitride, and/or silicon oxynitride. According to the present embodiment, the first organic insulating layer 171 may include, for example, polyimide. The first inorganic insulating layer 172 may include, for example, silicon nitride and may planarize a surface on which the data line 176, the first conductive layer 175, the lower power supply line 177, and the connection lines 173 and 174 are included.

The second conductive layer 179 and the upper power supply line 178 may be on the first inorganic insulating layer 172 and may have a single-layer structure or a multistack layer structure, for example, including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu), in consideration of conductivity or the like.

The second conductive layer 179 may have a stack structure, for example, of titanium (Ti)/aluminum (Al)/titanium (Ti). The first organic insulating layer 171 may include the first opening 171ha exposing the portion of the first conductive layer 175. The first inorganic insulating layer 172 may include the second opening 172ha exposing the portion of the first conductive layer 175 which is exposed through the first opening 171ha. The second conductive layer 179 may be electrically connected with the first conductive layer 175 through the first opening 171ha and the second opening 172ha. The first opening 171ha and the second opening 172ha may correspond to the contact hole 183 connecting the first conductive layer 175 and the second conductive layer 179. The upper power supply line 178 may be electrically connected with the lower power supply line 177 through the contact hole 183 in the first organic insulating layer 171 and the first inorganic insulating layer 172. For example, the power supply lines 177 and 178, i.e., the lower power supply line 177 and the upper power supply line 178, are on different layers and may occupy a reduced or minimum area. Also, the resistance of the power supply lines 177 and 178 may be reduced or minimized.

The upper power supply line 178 may include a portion 178a that protrudes to a portion of the second storage capacitor plate 127, which planarly overlaps the portion 178a. The upper power supply line 178 may be electrically connected to the lower power supply line 177 through the contact hole 187 in the first organic insulating layer 171 and the inorganic insulating layer 172. The lower power supply line 177 may be electrically connected to the second storage capacitor plate 127 through the contact hole 168 in the interlayer insulating layer 160. As a result, the upper power supply line 178 may be electrically connected to the second storage capacitor plate 127. For example, the protruding portion 178a of the upper power supply line 178 and the second storage capacitor plate 127 may serve as one capacitor plate. Such configuration may interoperate with the driving gate electrode 125a that functions as the first storage capacitor plate 125a, to thereby provide stable capacitance of the storage capacitor Cst. The storage capacitor Cst may planarly overlap the driving TFT T1 that occupies a large area in the pixel. By doing so, the storage capacitor Cst may occupy a reduced or minimal area in the pixel and may have high capacitance.

In order to form a high-resolution organic light-emitting display apparatus, the area of one pixel in the organic light-emitting display apparatus is decreased, to thereby allow a gap between conductive layers in the pixel to be very small. For example, the gap between the second conductive layer 179 and the upper power supply line 178 on a same layer may be very small. Thus, if the second conductive layer 179 and the upper power supply line 178 are not etched according to design, the second conductive layer 179 and the upper power supply line 178 may be short-circuited and thus cause the resulting pixel to be defective.

A layer including an organic material is below the second conductive layer 179 and the upper power supply line 178. A metal material in the second conductive layer 179 and the upper power supply line 178 is not completely etched. If the etching time is increased to completely etch the second conductive layer 179 and the upper power supply line 178, even an undesired layer is etched.

However, according to the present embodiment, the first inorganic insulating layer 172 is below the second conductive layer 179 and the upper power supply line 178 and is between the first organic insulating layer 171 and the second conductive layer 179/the upper power supply line 178. It is therefore possible to prevent or decrease a problem in which the second conductive layer 179 and the upper power supply line 178 are not etched as planned due to an organic material. Therefore, the likelihood of a defective pixel being formed due to a short between the second conductive layer 179 and the upper power supply line 178 may be prevented or decreased.

According to the present embodiment, a width L1 of the first opening 171ha in the first organic insulating layer 171 may be greater than a width L2 of the second opening 172ha in the first inorganic insulating layer 172. The portion of the first inorganic insulating layer 172 may extend to the first opening 171ha to directly contact the first conductive layer 175.

The second organic insulating layer 181 may be over the first inorganic insulating layer 172 to cover the second conductive layer 179 and upper power supply line 178. The second organic insulating layer 181 may include an organic material, e.g., acryl, benzocyclobutene (BCB), polyimide, hexamethyldisiloxane (HMDSO). For example, the second organic insulating layer 181 may include, for example, polyimide. The second organic insulating layer 181 may include a third opening 181h exposing the second conductive layer 179. The pixel electrode 191 of the organic light-emitting device OLED may be electrically connected to the second conductive layer 179 through the third opening 181h. The third opening 181h may correspond to the contact hole 185 through which the pixel electrode 191 is connected to the second conductive layer 179.

The organic light-emitting device OLED including the pixel electrode 191, an intermediate layer 192 over the pixel electrode 191 and including an emission layer, and the opposite electrode 193 over the intermediate layer 192 may be over the second organic insulating layer 181. The pixel electrode 191 may be electrically connected to the emission control drain region 135f of the emission control active layer ACTf via the second conductive layer 179 and the first conductive layer 175.

The pixel electrode 191 may be a translucent electrode or a reflective electrode. When the pixel electrode 191 is the translucent electrode, the pixel electrode 191 may include a transparent conductive layer. The transparent conductive layer may include, for example, at least one of indium tin oxide (ITO), indium zinc oxide (IZO), zinc oxide (ZnO), indium oxide ($In_2O_3$), indium gallium oxide (IGO), or aluminum zinc oxide (AZO). In addition to the transparent conductive layer, the pixel electrode 191 may include a transflective layer for increasing luminescent efficiency. The transflective layer may be a thin layer, for example, several to several tens of nanometers thick and may include at least one of Ag, Mg, Al, Pt, Pd, Au, Ni, Nd, Ir, Cr, Li, Ca, or Yb.

When the pixel electrode 191 is a reflective electrode, the pixel electrode 191 may include a reflective layer including Ag, Mg, Al, Pt, Pd, Au, Ni, Nd, Ir, Cr, or a compound thereof, and a transparent conductive layer on and/or below the reflective layer. The transparent conductive layer may include at least one of ITO, IZO, ZnO, $In_2O_3$, indium oxide, IGO, or AZO. In another embodiment, the pixel electrode 191 may include at least one of various materials and may have a single-layer structure or a multilayer structure. A pixel defining layer may include an opening exposing at least a portion of the pixel electrode 191 and may be disposed over the pixel electrode 191.

The intermediate layer 192 over the pixel electrode 191 may include, for example, a small-molecule or polymer material. When the intermediate layer 192 includes the small-molecule material, the intermediate layer 192 may have a structure in which a hole injection layer (HIL), a hole transport layer (HTL), an emission layer (EML), an electron transport layer (ETL), an electron injection layer (EIL), and the like are singularly or multiply stacked. The intermediate layer 192 may include various organic materials, for example, including copper phthalocyanine (CuPc), N,N'-Di(naphthalene-1-yl)-N,N'-diphenyl-benzidine (NPB), tris-8-hydroxyquinoline aluminum)(Alq3), and the like. The aforementioned layers may be formed, for example, by a vacuum deposition method.

When the intermediate layer 192 includes a polymer material, the intermediate layer 192 may have a structure generally including a HTL and an EML. The HTL may include, for exame, poly-(2,4)-ethylene-dihydroxy thiophene (PEDOT). The EML may include, for example, poly-phenylene vinylene (PPV)-based polymer materials, polyfluorene-based polymer materials, and the like. The intermediate layer 192 may be formed, for example, by a screen printing method, an inkjet printing method, a laser induced thermal imaging (LITI) method, or the like.

The intermediate layer 192 may have a different structure in another embodiment. The intermediate layer 192 may include one layer extending over the pixel electrodes 191 respectively included in a plurality of pixels or may include a layer that is patterned to correspond to each of the pixel electrodes 191.

The opposite electrode 193 may be formed as one body extending over the pixels and thus may correspond to the pixel electrodes 191. The opposite electrode 193 may be a translucent electrode or a reflective electrode. When the opposite electrode 193 is a translucent electrode, the opposite electrode 193 may include at least one of Ag, Al, Mg, Li, Ca, Cu, LiF/Ca, LiF/Al, MgAg, or CaAg and may be formed as a thin layer of several to several tens of nanometers. When the opposite electrode 193 is formed as the reflective electrode, the opposite electrode 193 may include at least one of Ag, Al, Mg, Li, Ca, Cu, LiF/Ca, LiF/Al, MgAg, or CaAg. The structure and material of the opposite electrode 193 may be different in another embodiment.

Figure 11:
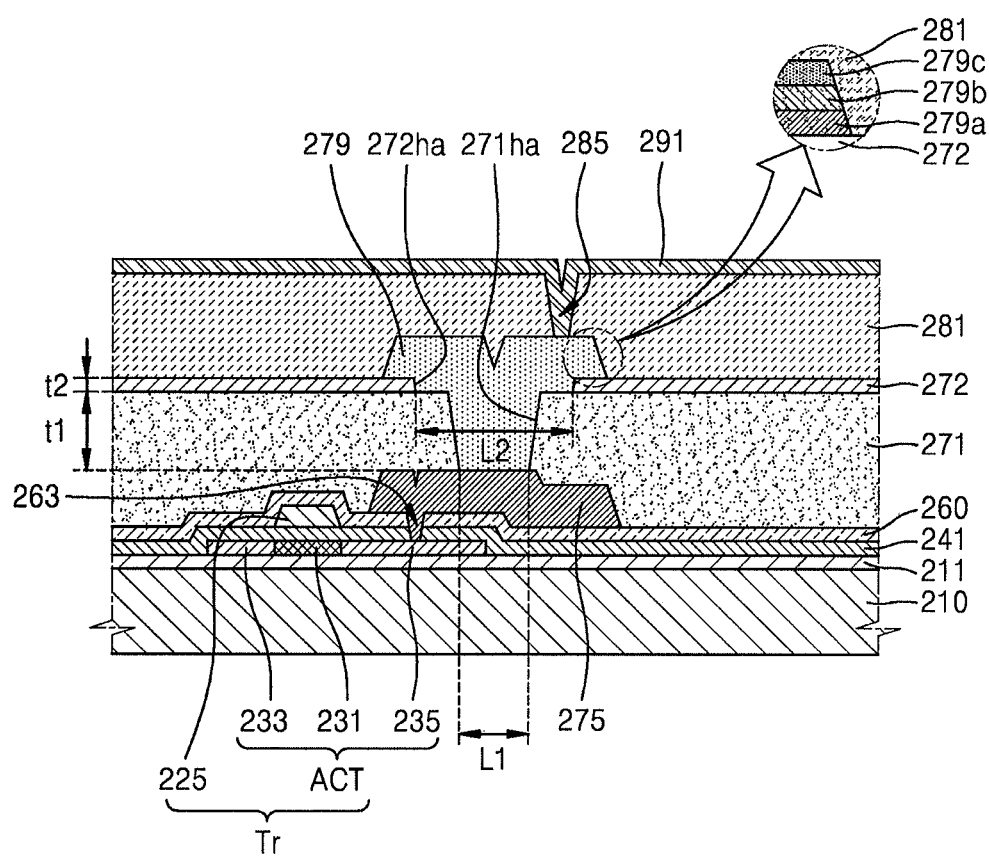
FIGS. 11 to 14 illustrate cross-sectional views of additional embodiments of an organic light-emitting display.

FIGS. 11 to 14 are cross-sectional views of an embodiment of an organic light-emitting display apparatus. Referring to FIG. 11, the organic light-emitting display apparatus includes a plurality of pixels, at least one of which includes a first conductive layer 275 over a substrate 210, a first organic insulating layer 271 including a first opening 271*ha* exposing a portion of the first conductive layer 275, a first inorganic insulating layer 272 over the first organic insulating layer 271 and including a second opening 272*ha* exposing the portion of the first conductive layer 275 which is exposed through the first opening 271*ha*, and a second conductive layer 279 on the first inorganic insulating layer 272 and contacting the portion of the first conductive layer 275 exposed through the first opening 271*ha* and the second opening 272*ha*.

A buffer layer 211 may be over the substrate 210. A TFT Tr including an active layer ACT and a gate electrode 225 may be over the buffer layer 211. The active layer ACT may include a channel region 231 for connecting a source region 233 and a drain region 235. The source region 233, the drain region 235, and the channel region 231 include a semiconductor material are doped with impurities and thus have conductivity. A first insulating layer 241 may be between the active layer ACT and the gate electrode 225. An interlayer insulating layer 260 may be over the first insulating layer 241 to cover the gate electrode 225. The TFT Tr may be, for example, one of a driving TFT, an emission control TFT, or the like.

The first conductive layer 275 may be over the interlayer insulating layer 260 and may contact the drain region 235 of the active layer ACT through a contact hole 263 in the first insulating layer 241 and the interlayer insulating layer 260. The first organic insulating layer 271 and the first inorganic insulating layer 272 are over the first conductive layer 275. The first organic insulating layer 271 includes an organic material and thus planarizes a surface on which the second conductive layer 279 is to be arranged.

The first inorganic insulating layer 272 performs a passivation function and also prevents at least portions of the first organic insulating layer 271 and the second conductive layer 279 from contacting each other.

The second conductive layer 279 may be formed by disposing a conductive material on the first inorganic insulating layer 272 and then etching the conductive material. The first inorganic insulating layer 272 may separate the first organic insulating layer 271 from a portion of the conductive material to be removed. If the conductive material directly contacts the first organic insulating layer 271, a problem may occur where the conductive material is not completely removed when the conductive material is etched. In order to prevent this problem, the first inorganic insulating layer 272 may be between the conductive material and the first organic insulating layer 271.

The second conductive layer 279 may be on the first inorganic insulating layer 272. For example, the second conductive layer 279 may have a stack structure including a first layer 279*a* including titanium (Ti), a second layer 279*b* on the first layer 279*a* and including aluminum (Al), and a third layer 279*c* including titanium (Ti) and on the second layer 279*b*. The first conductive layer 275 and the second conductive layer 279 may have a same structure. In another embodiment, each of the first conductive layer 275 and the second conductive layer 279 may include at least one of various metal materials or a combination of various metal materials taking into account conductivity, or the like.

The second conductive layer 279 may be electrically connected to the first conductive layer 275 through the first opening 271*ha* in the first organic insulating layer 271 and the second opening 272*ha* in the first inorganic insulating layer 272. Since a width L2 of the second opening 272*ha* is greater than a width L1 of the first opening 271*ha*, the first opening 271*ha* may be completely exposed due to the second opening 272*ha*. The first organic insulating layer 271 may include an organic material, may planarize the surface on which the second conductive layer 279 or the like is disposed, and may have a thickness t1.

The thickness t1 of the first organic insulating layer 271 may be greater than the thickness t2 of the first inorganic insulating layer 272. For example, the thickness t1 of the first organic insulating layer 271 may be between about 1.6 μm and about 1.8 μm. The thickness t2 of the first inorganic insulating layer 272 may be between about 0.5 μm and about 0.6 μm. Thus, the thickness t1 of the first organic insulating layer 271 may be at least two times greater than the thickness t2 of the first inorganic insulating layer 272.

A second organic insulating layer 281 may be over the first inorganic insulating layer 272 to cover the second conductive layer 279. A pixel electrode 291 may be over the second organic insulating layer 281 to contact the second conductive layer 279 through a contact hole 285 in the second organic insulating layer 281.

Figure 12:
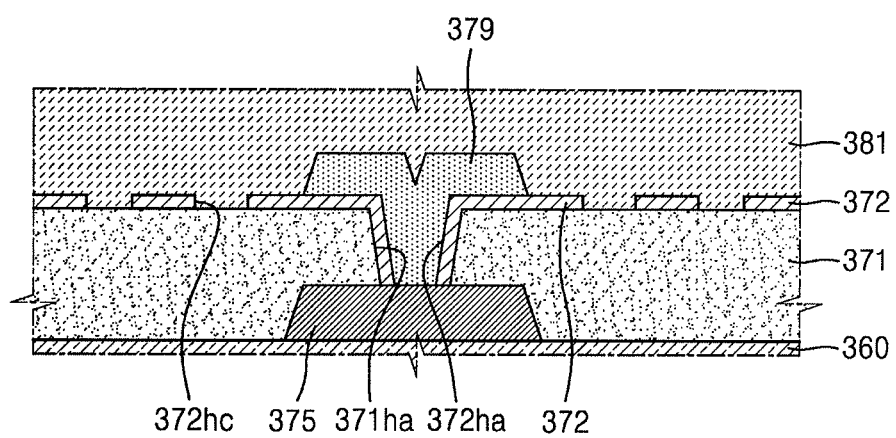

Referring to FIG. 12, the organic light-emitting display apparatus according to the present embodiment includes a plurality of pixels. At least one of the pixels includes a first conductive layer 375 over a substrate, a first organic insulating layer 371 including a first opening 371*ha* exposing a portion of the first conductive layer 375, a first inorganic insulating layer 372 over the first organic insulating layer 371 and including a second opening 372*ha* exposing the portion of the first conductive layer 375 exposed through the first opening 371*ha*, and a second conductive layer 379 over the first inorganic insulating layer 372 and contacting the portion of the first conductive layer 375 exposed through the first opening 371*ha* and the second opening 372*ha*.

The first conductive layer 375 may be electrically connected to another conductive layer in a TFT below an interlayer insulating layer 360. The second conductive layer 379 may be electrically connected to another conductive layer over a second organic insulating layer 381.

The first inorganic insulating layer 372 may be over the first organic insulating layer 371 and may include openings 372*hc* in addition to the second opening 372*ha*. A portion of the first organic insulating layer 371 may be exposed through the additional openings 372*hc*. This may prevent that gas generated in the first organic insulating layer 371 from being trapped by the first inorganic insulating layer 372, and thus may decrease the lifetime of the organic light-emitting display apparatus. The additional openings 372*hc* may serve as discharge paths of the gas generated in the first organic insulating layer 371.

The first organic insulating layer 371 and the second organic insulating layer 381 may contact each other through the additional openings 372*hc*. The additional openings 372*hc* may also be formed in a portion of the first inorganic insulating layer 372 covered by the second conductive layer 379.

Figure 13:
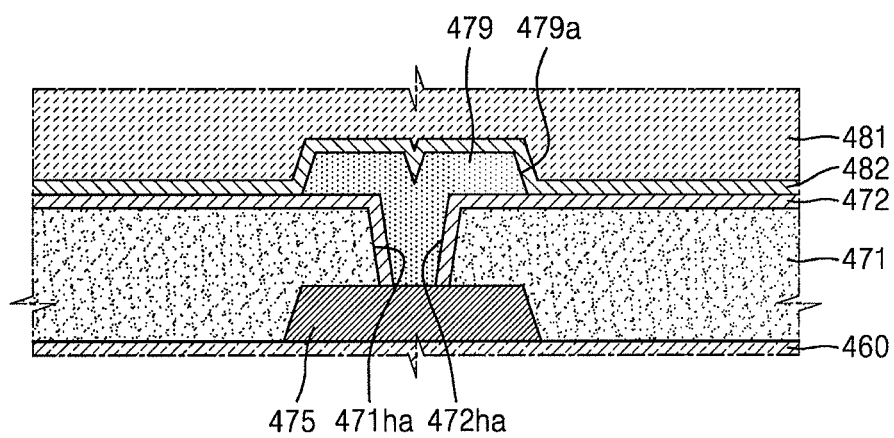

Referring to FIG. 13, the organic light-emitting display apparatus according to the present embodiment includes a plurality of pixels. At least one of the pixels includes a first conductive layer 475 over a substrate, a first organic insulating layer 471 including a first opening 471*ha* exposing a portion of the first conductive layer 475, a first inorganic insulating layer 472 over the first organic insulating layer 471 and including a second opening 472*ha* exposing the portion of the first conductive layer 475 exposed through the first opening 471*ha*, and a second conductive layer 479 on the first inorganic insulating layer 472 and contacting the portion of the first conductive layer 475 exposed through the first opening 471*ha* and the second opening 472*ha*.

The first inorganic insulating layer 472 may be over the first organic insulating layer 471. A second inorganic insulating layer 482 may be over the first inorganic insulating layer 472 to cover the second conductive layer 479. Thus, the second inorganic insulating layer 482 may be between the second conductive layer 479 and a second organic insulating layer 481 and may include an inorganic material, e.g., silicon oxide, silicon nitride, and/or silicon oxynitride.

The second inorganic insulating layer 482 may protect the second conductive layer 479 and may cover a top surface and edges 479*a* of the second conductive layer 479. The second inorganic insulating layer 482 may extend from the top surface of the second conductive layer 479, may cover the edges 479*a* of the second conductive layer 479, and then may continuously extend to a top surface of the first inorganic insulating layer 472 to directly contact the first inorganic insulating layer 472. Thus, the second conductive layer 479 may be completely surrounded by the first inorganic insulating layer 472 and the second inorganic insulating layer 482.

Figure 14:
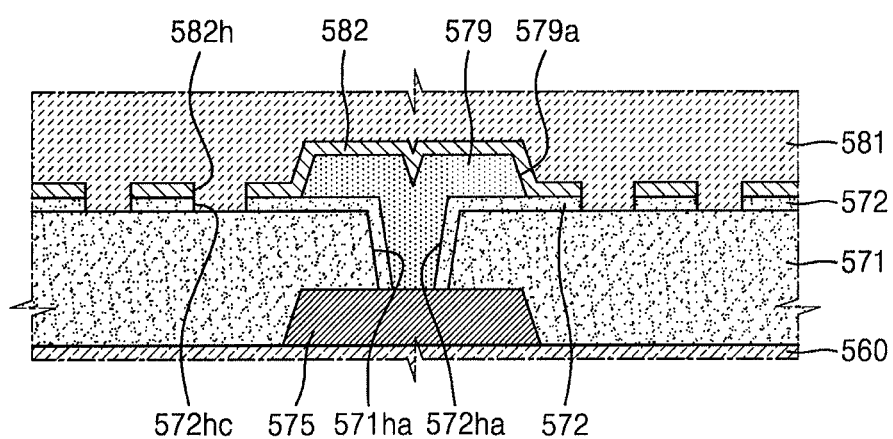

Referring to FIG. 14, the organic light-emitting display apparatus according to the present embodiment includes a plurality of pixels. At least one of the pixels includes a first conductive layer 575 over a substrate, a first organic insulating layer 571 including a first opening 571*ha* exposing a portion of the first conductive layer 575, a first inorganic insulating layer 572 over the first organic insulating layer 571 and including a second opening 572*ha* exposing the portion of the first conductive layer 575 exposed through the first opening 571*ha*, and a second conductive layer 579 on the first inorganic insulating layer 572 and contacting the portion of the first conductive layer 575 exposed through the first opening 571*ha* and the second opening 572*ha*.

The first inorganic insulating layer 572 may be over the first organic insulating layer 571. A second inorganic insulating layer 582 may be over the first inorganic insulating layer 572 to cover the second conductive layer 579. The second inorganic insulating layer 582 may protect the second conductive layer 579 and may cover a top surface and edges 579*a* of the second conductive layer 579. The second inorganic insulating layer 582 may include portions that directly contact the second conductive layer 579.

The first inorganic insulating layer 572 may include a plurality of openings 572*hc* in addition to the second opening 572*ha*. Portions of the first organic insulating layer 571 may be exposed through the additional openings 572*hc*. The second inorganic insulating layer 582 may include fourth openings 582*h* corresponding to the additional openings 572*hc* of the first inorganic insulating layer 572. The portions of the first organic insulating layer 571 exposed through the additional openings 572*hc* of the first inorganic insulating layer 572 may be exposed through the fourth openings 582*h*. This is to reduce or prevent gas generated in the first organic insulating layer 571 from being trapped by the first inorganic insulating layer 572 and the second inorganic insulating layer 582 and which may also decrease the lifetime of the organic light-emitting display apparatus. The additional openings 572*hc* and the fourth openings 582*h* may serve as discharge paths of the gas generated in the first organic insulating layer 571.

The first organic insulating layer 571 and the second inorganic insulating layer 582 may contact each other through the additional openings 572*hc* and the fourth openings 582*h*.

In the organic light-emitting display apparatus according to the aforementioned one or more embodiments, the first organic insulating layer (171, 271, 371, 471, or 571) is below the second conductive layer (179, 279, 379, 479, or 579) to planarize a surface on which the second conductive layer is disposed. The first inorganic insulating layer is between the first organic insulating layer and the second conductive layer so that it is possible to prevent a problem in which the second conductive layer is not completely etched and thus is connected to adjacent conductive layers from which the second conductive layer was designed to be electrically disconnected.

In accordance with one or more embodiments, an organic light-emitting display apparatus prevents a problem in which conductive layers designed to be electrically insulated from each other are not etched according to design and electrically connected, therefore forming a defective pixel.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. An organic light-emitting display apparatus, comprising:
    a plurality of pixels, at least one of the pixels including:
        a first conductive layer over a substrate;
        a first organic insulating layer directly on the first conductive layer, the first organic insulating layer including a first opening exposing a portion of the first conductive layer;
        a first inorganic insulating layer over the first organic insulating layer, the first inorganic insulating layer including a second opening exposing the portion of the first conductive layer exposed through the first opening;
        a second conductive layer on the first inorganic insulating layer, the second conductive layer contacting the portion of the first conductive layer exposed through the first opening and the second opening, the second conductive layer also making direct contact with a top surface of the first organic layer;
        a second organic insulating layer over the second conductive layer, the second organic insulating layer including a third opening exposing the second conductive layer; and
        a pixel electrode contacting the second conductive layer through the third opening, wherein the second organic insulating layer is arranged between the second conductive layer and the pixel electrode.

2. The apparatus as claimed in claim 1, further comprising:
    a thin film transistor (TFT) including an active layer and a gate electrode insulated from the active layer, wherein the active layer includes a channel region to connect a source region and a drain region, and the first conductive layer is electrically connected to the source region or the drain region.

3. The apparatus as claimed in claim 1, wherein a thickness of the first organic insulating layer is greater than a thickness of the first inorganic insulating layer.

4. The apparatus as claimed in claim 1, wherein the first inorganic insulating layer includes a plurality of additional openings exposing the first organic insulating layer.

5. The apparatus as claimed in claim 4, wherein the first organic insulating layer directly contacts the second organic insulating layer directly through at least one of the additional openings.

6. The apparatus as claimed in claim 1, further comprising:
    a second inorganic insulating layer between the second conductive layer and the second organic insulating layer.

7. The apparatus as claimed in claim 6, wherein the second inorganic insulating layer covers edges of the second conductive layer and includes a portion that contacts the first inorganic insulating layer.

8. The apparatus as claimed in claim 1, further comprising:
    an intermediate layer over the pixel electrode and including an emission layer; and
    an opposite electrode over the intermediate layer.

9. The apparatus as claimed in claim 1, further comprising:
    a lower power supply line on a same layer as the first conductive layer; and
    an upper power supply line on a same layer as the second conductive layer.

10. The apparatus as claimed in claim 9, wherein the lower power supply line and the upper power supply line are electrically connected to each other through contact holes in the first organic insulating layer and the first inorganic insulating layer.

11. The apparatus as claimed in claim 9, further comprising:
    a storage capacitor including a first plate over the substrate, and
    a second plate facing the first plate, wherein
    the second plate is on a layer different from the lower power supply line and the upper power supply line, and
    the second plate is electrically connected to the lower power supply line and the upper power supply line.

12. The apparatus as claimed in claim 1, wherein:
    the first organic insulating layer includes polyimide, and
    the first inorganic insulating layer includes silicon oxide ($SiO_2$) or silicon nitride ($SiN_x$).

13. The apparatus as claimed in claim 1, wherein:
    the second conductive layer includes a first layer which includes titanium,
    a second layer which includes aluminum, and
    a third layer which includes titanium.

14. The apparatus as claimed in claim 1, wherein
    the second conductive layer makes direct contact with the top surface of the first organic layer inside the second opening, and
    no portion of the first inorganic insulating layer directly contacts the first conductive layer in the first opening.

15. An organic light-emitting display apparatus, comprising:
    a substrate: and
    a plurality of pixels, at least one of the pixels including:
        a first conductive layer over the substrate;

a first organic insulating layer directly on the first conductive layer, the first organic insulating layer including a first opening exposing a portion of the first conductive layer;

a first inorganic insulating layer over the first organic insulating layer, the first inorganic insulating layer including a second opening exposing the portion of the first conductive layer exposed through the first opening;

a second conductive layer on the first inorganic insulating layer, the second conductive layer contacting the portion of the first conductive layer exposed through the first opening and the second opening;

a second organic insulating layer over the second conductive layer, the second organic insulating layer including a third opening exposing the second conductive layer; and a pixel electrode contacting the second conductive layer through the third opening, wherein the second organic insulating layer is arranged between the second conductive layer and the pixel electrode, the first inorganic insulating layer includes a plurality of additional opening exposing the first organic insulating layer, and the first organic insulating layer directly contracts the second organic insulating layer directly through at least one of the additional openings.

16. A pixel, comprising:

first and second conductive layers;

first and second insulating layers;

an organic insulating layer over the second conductive layer; and a pixel electrode contacting the second conductive layer through the organic insulating layer, the organic insulating layer being between the second conductive layer and the pixel electrode, wherein the first and second insulating layers are between the first and second conductive layers, the second insulating layer is directly between the first insulating layer and the second conductive layer, the second conductive layer makes direct contact with a top surface of the first insulating layer, the first insulating layer includes an organic material, the second insulating layer includes an inorganic material, and the first conductive layer contacts the second conductive layer through a first hole in the first insulating layer and a second hole in the second insulating layer.

17. The pixel as claimed in claim 16, wherein the first hole in the first insulating layer is aligned with the second hole in the second insulating layer.

18. The pixel as claimed in claim 17, wherein the first and second insulating layers have different thicknesses.

19. The pixel as claimed in claim 18, wherein the second insulating layer is thinner than the first insulating layer.

20. The pixel as claimed in claim 16, wherein the second conductive layer makes direct contact with the top surface of the first insulating layer inside the second hole, and no portion of the first inorganic insulating layer directly contacts the first conductive layer in the first opening.

* * * * *